(12) United States Patent
Suh et al.

(10) Patent No.: US 12,733,310 B2
(45) Date of Patent: Sep. 8, 2026

(54) DISPLAY MODULE AND MANUFACTURING METHOD AS THE SAME

(71) Applicant: SAMSUNG ELECTRONICS CO., LTD., Suwon-si (KR)

(72) Inventors: Jenghun Suh, Suwon-si (KR); Dai Aoki, Yokohama (JP); Sungtae Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 649 days.

(21) Appl. No.: 17/863,050

(22) Filed: Jul. 12, 2022

(65) Prior Publication Data

US 2022/0352435 A1 Nov. 3, 2022

Related U.S. Application Data

(63) Continuation of application No. PCT/KR2021/020140, filed on Dec. 29, 2021.

(30) Foreign Application Priority Data

Feb. 2, 2021 (KR) ........................ 10-2021-0014890

(51) Int. Cl.
*H10H 20/851* (2025.01)
*H10H 20/854* (2025.01)
(Continued)

(52) U.S. Cl.
CPC ...... *H10H 20/8514* (2025.01); *H10H 20/854* (2025.01); *H10H 20/857* (2025.01); *H10H 29/142* (2025.01)

(58) Field of Classification Search
CPC ............. H10H 20/8514; H10H 20/854; H10H 20/857; H10H 29/142; H10H 20/812;
(Continued)

(56) References Cited

U.S. PATENT DOCUMENTS 9,799,634 B2 10/2017 Rhee
9,837,388 B2 12/2017 Rhee et al.
(Continued)

FOREIGN PATENT DOCUMENTS

CN 103367381 A 10/2013
CN 109638044 A 4/2019
(Continued)

OTHER PUBLICATIONS

Communication dated Jan. 26, 2024 issued the European Patent Office in European Application No. 21925004.0.
(Continued)

*Primary Examiner* — Eliseo Ramos Feliciano
*Assistant Examiner* — Thaddeus J Kolb
(74) *Attorney, Agent, or Firm* — Sughrue Mion, PLLC

(57) ABSTRACT

A display module is provided. The display module includes a substrate, a conductive light absorption layer provided on a surface of the substrate, and a plurality of pixels electrically coupled to the substrate through the conductive light absorption layer. Each of the plurality of pixels may include a first self-luminescence element, a second self-luminescence element and a third self-luminescence element, each emitting light of a same color, a first color conversion layer corresponding to a light emitting surface of the first self-luminescence element and a second color conversion layer corresponding to a light emitting surface of the second self-luminescence element, and a first color filter corresponding to the first color conversion layer and a second color filter corresponding to the second color conversion layer.

19 Claims, 18 Drawing Sheets

(51) Int. Cl.

| | |
|---|---|
| ***H10H 20/857*** | (2025.01) |
| ***H10H 29/14*** | (2025.01) |

(58) Field of Classification Search

CPC . H01L 25/167; H01L 25/0753; H10D 62/054; H10D 30/0295; H10D 84/8316; H10D 84/858; H10D 30/6215; H10D 62/8162; C09K 11/77; C09K 11/663; C09K 11/7734; C09K 11/77348; G02B 1/02; G02B 1/04; G02B 5/00; G02B 5/20; G02B 5/003; G02B 5/206; G02B 5/208; A23B 11/162; B82Y 20/00; G08G 5/21; H10F 77/12485

See application file for complete search history.

(56) References Cited

U.S. PATENT DOCUMENTS

| | | | |
|---|---|---|---|
| 9,842,764 | B2 | 12/2017 | Bang |
| 9,935,153 | B1 | 4/2018 | Jung et al. |
| 10,083,944 | B2 | 9/2018 | Lee |
| 10,930,713 | B2 | 2/2021 | Lee |
| 10,937,995 | B2 | 3/2021 | Xia et al. |
| 10,971,543 | B2 | 4/2021 | Hwang et al. |
| 11,088,301 | B2 | 8/2021 | Choi et al. |
| 11,398,500 | B2 | 7/2022 | Sakong et al. |
| 2012/0112220 | A1 | 5/2012 | West et al. |
| 2014/0312368 | A1 | 10/2014 | Lee et al. |
| 2016/0043061 | A1 | 2/2016 | Rhee |
| 2016/0181294 | A1 | 6/2016 | Zhao |
| 2017/0162115 | A1 | 6/2017 | Chen et al. |
| 2018/0076182 | A1 | 3/2018 | Wu et al. |
| 2018/0151543 | A1 | 5/2018 | Lee |
| 2018/0350871 | A1 | 12/2018 | Lee et al. |
| 2019/0122592 | A1 | 4/2019 | Han et al. |
| 2019/0267359 | A1 | 8/2019 | Wu et al. |
| 2020/0075820 | A1 | 3/2020 | Han et al. |
| 2021/0013236 | A1 | 1/2021 | Sakong et al. |
| 2021/0165266 | A1 * | 6/2021 | Nakakomi ........ G02F 1/133308 |
| 2022/0093819 | A1 * | 3/2022 | Chen .......................... C09J 5/06 |
| 2023/0025844 | A1 * | 1/2023 | Lee ........................ B60Q 1/143 |
| 2023/0047411 | A1 * | 2/2023 | Kawada ................ H10W 90/00 |
| 2023/0078708 | A1 * | 3/2023 | Chaji ................. H10D 86/0214<br>257/776 |

FOREIGN PATENT DOCUMENTS

| | | | | | |
|---|---|---|---|---|---|
| CN | 110024484 | A | | 7/2019 | |
| EP | 3349258 | A1 | | 7/2018 | |
| EP | 3550937 | A1 | | 10/2019 | |
| JP | 11-309902 | A | | 11/1999 | |
| KR | 10-2012-0076940 | A | | 7/2012 | |
| KR | 20120076940 | A | * | 7/2012 | ............. H10K 71/00 |
| KR | 10-2014-0119515 | A | | 10/2014 | |
| KR | 10-1476686 | B1 | | 12/2014 | |
| KR | 10-1688160 | B1 | | 12/2016 | |
| KR | 10-2017-0057322 | A | | 5/2017 | |
| KR | 10-2018-0028822 | A | | 3/2018 | |
| KR | 10-2018-0130357 | A | | 12/2018 | |
| KR | 10-2018-0131329 | A | | 12/2018 | |
| KR | 20180131329 | A | * | 12/2018 | ............ H10W 90/00 |
| KR | 10-2019-0046684 | A | | 5/2019 | |
| KR | 20190046684 | A | * | 5/2019 | ............. H01L 33/52 |
| KR | 10-2020-0030904 | A | | 3/2020 | |
| KR | 10-2020-0041044 | A | | 4/2020 | |
| KR | 102135352 | B1 | * | 7/2020 | ............ H10W 90/00 |
| KR | 10-2021-0006567 | A | | 1/2021 | |
| WO | 2020/054575 | A1 | | 3/2020 | |

OTHER PUBLICATIONS

International Search Report dated Apr. 28, 2022 issued by the International Searching Authority in International Application No. PCT/KR2021/020140 (PCT/ISA/210).

International Written Opinion dated Apr. 28, 2022 issued by the International Searching Authority in International Application No. PCT/KR2021/020140 (PCT/ISA/237).

Communication issued Jan. 16, 2025 by the Korean Intellectual Property Office in Korean Patent Application No. 10-2021-0014890.

Communication dated Apr. 2, 2025, issued by the European Patent Office in European Application No. 21925004.0.

Communication issued on Sep. 6, 2025 by the Korean Intellectual Property Office in Korean Patent Application No. 10-2021-0014890.

Communication dated May 29, 2026 issued by the China National Intellectual Property Administration in Chinese Patent Application No. 202180071884.8.

* cited by examiner

DISPLAY MODULE AND MANUFACTURING METHOD AS THE SAME

CROSS-REFERENCE TO RELATED APPLICATIONS

This application is a bypass continuation of International Application No. PCT/KR2021/020140, filed on Dec. 29, 2021, which is based on and claims priority to Korean Patent Application No. 10-2021-0014890, filed on Feb. 2, 2021, in the Korean Intellectual Property Office, the disclosures of which are incorporated by reference herein in their entireties.

BACKGROUND

1. Field

The disclosure relates to a display module using a self-luminescence element for displaying an image and a manufacturing method thereof.

2. Description of the Related Art

An image may be displayed without backlight when a self-luminescence element for displaying an image is used in a display panel. The display panel may express a variety of colors while being operated in a pixel or sub pixel unit formed of self-luminescence elements. Respective pixels or sub pixels may be controlled in operation by a thin film transistor (TFT).

Display panels which use self-luminescence elements have used anisotropic conductive films rather than micro-bumps for coupling between the self-luminescence element and the TFT to secure mass-producibility. However, when the self-luminescence element is emitted, because light emitted from one sub pixel within a pixel is guided until an adjacent sub pixel and different color lights are mixed between the sub pixels and between the pixels, a cross-talk phenomenon may appear.

SUMMARY

Provided are a display module which absorbs light being emitted from a side surface and a rear surface of a self-luminescence element and prevents the light from being reflected to an adjacent sub pixel and a manufacturing method thereof.

In accordance with an aspect of the disclosure, a display module may include a substrate, a conductive light absorption layer provided on a surface of the substrate, and a plurality of pixels electrically coupled to the substrate through the conductive light absorption layer. Each of the plurality of pixels may include a first self-luminescence element, a second self-luminescence element and a third self-luminescence element emitting light of a same color, a first color conversion layer corresponding to a light emitting surface of the first self-luminescence element and a second color conversion layer corresponding to a light emitting surface of the second self-luminescence element, and a first color filter corresponding to the first color conversion layer and a second color filter corresponding to the second color conversion layer. An area of the first color conversion layer is greater than an area of the first self-luminescence element and an area of the second color conversion layer are greater than an area of the second self-luminescence element.

The conductive light absorption layer may include a transparent resin, a first plurality of conductive balls provided in the transparent resin, and a plurality of light absorbing materials provided in the transparent resin.

The transparent resin may include an epoxy resin, a polyurethane resin, or an acrylic resin.

Each of the first plurality of conductive balls may include a polymer particle, and a conductive film coated on a surface of the polymer particle. The conductive film may include gold (Au), nickel (Ni), or palladium (Pd).

The plurality of light absorbing materials may include metal nanoparticles configured to absorb light.

The metal nanoparticles may include Au, platinum (Pt), silver (Ag), an Au alloy, a Pt alloy or an Ag alloy.

The conductive light absorption layer may include a resin with a black-based color, and a second plurality of conductive balls provided in the transparent resin.

The first self-luminescence element, the second self-luminescence element, and the third self-luminescence element may include a blue micro light emitting diode (LED).

The display module may further include a partition wall separating first self-luminescence element, the second self-luminescence element, and the third self-luminescence element, and the partition wall may be configured to reflect light emitted from a first light scattering layer, a second light scattering layer, and a third light scattering layer, a side surface of the first color conversion layer, and a side surface of the second color conversion layer.

The partition wall may be a white-based color.

The partition wall may include a metal film at a surface of the partition wall.

The side surface of the first self-luminescence element and the side surface of the second self-luminescence element, and a side surface of the third self-luminescence element may be adhered to the partition wall by an optical adhesive.

The first color conversion layer may be configured such that an area not corresponding to the light emitting surface of the first self-luminescence element from an entire area of one surface of the first color conversion layer is in contact with the optical adhesive.

The optical adhesive may include an ultraviolet (UV) curing silicon rubber.

The first color conversion layer may include a first color conversion material which emits light of a red wavelength range, and the second color conversion layer may include a second color conversion material which emits light of a green wavelength range.

DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
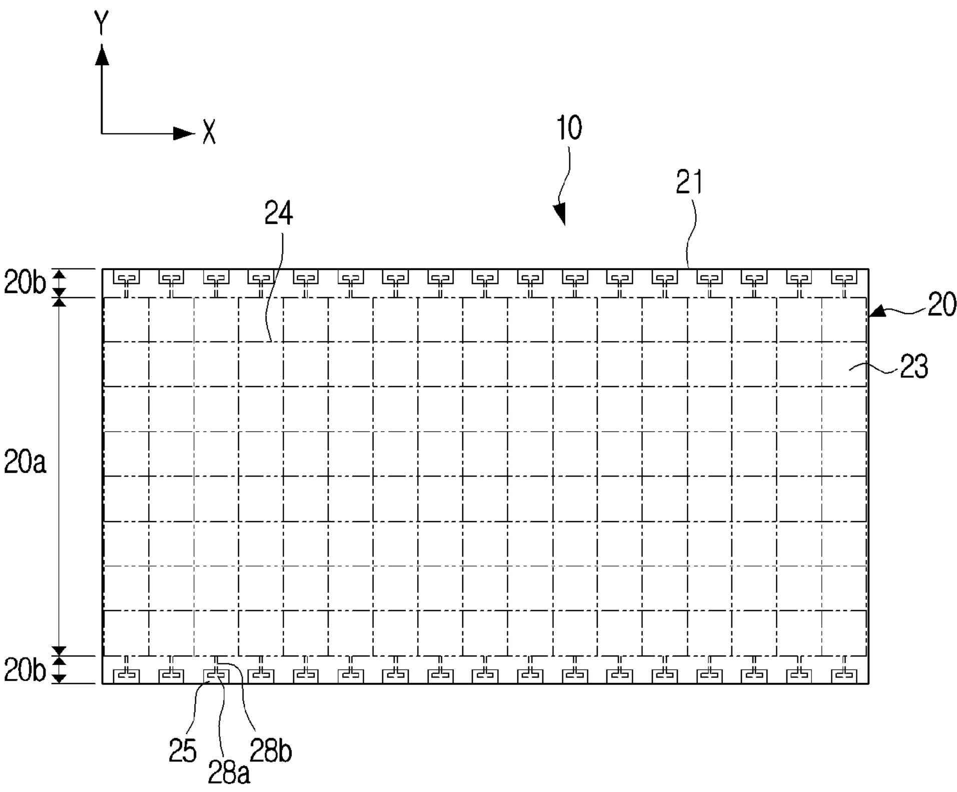
FIG. 1 is diagram illustrating a display module according to an embodiment.

Various embodiments will be described in greater detail below with reference to the accompanied drawings. The embodiments described herein may be variously modified. Specific embodiments may be illustrated in the drawings and described in detail in the description. However, the specific embodiments described in the accompanied drawings are merely to assist in the understanding of the various embodiments. Accordingly, the various embodiments disclosed in the accompanied drawings are not for limiting the scope of the disclosure to a specific embodiment, and should be interpreted to include all modifications or alternatives included in the technical spirit and scope of the embodiments.

Terms including ordinal numbers such as first, second, and the like may be used to describe various elements, but these elements are not limited by the above-described terms. The above-described terms may be used only to distinguish one element from another element.

In the disclosure, it is to be understood that the terms such as "comprise," "include," or the like are used herein to designate a presence of a characteristic, number, step, operation, element, component, or a combination thereof, and not to preclude a presence or a possibility of adding one or more of other characteristics, numbers, steps, operations, elements, components or a combination thereof. When a certain element is indicated as being "coupled with/to" or "connected to" another element, it is to be understood that the certain element may be directly coupled to or connected to the another element, but that another element may be present therebetween. On the other hand, when a certain element is indicated as being "directly coupled with/to" or "directly connected to" another element, it is to be understood that another element is not present therebetween.

In the disclosure, the expression 'same' may not only mean fully matching, but also include a difference to a degree of taking into consideration a processing error range.

In addition thereto, in describing the disclosure, in case it is determined that the detailed description of related known technologies may unnecessarily confuse the gist of the disclosure, the detailed description thereof will be abridged or omitted.

In the disclosure, a display module may be a display panel provided with a micro light-emitting diode which is a self-luminescence element for displaying an image. The display module may be one from among a flat panel display panel, each of which are configured with a plurality of inorganic light-emitting diodes (LEDs) of less than or equal to 100 micrometers and may provide better contrast, response time and energy efficiency than a liquid crystal display (LCD) panel which requires a backlight. Because the micro light emitting diode used for displaying an image is a self-luminescence element, the display module may not need to have a separate backlight.

In the disclosure, both an organic LED (OLED) and a micro LED, which is an inorganic light-emitting diode, have good energy efficiency, but the micro LED has longer brightness, light-emitting efficiency, and life span than the OLED. The micro LED may be a semiconductor chip configured to emit light on its own when power is supplied. The micro LED may have a fast response rate, low power, and a high brightness. For example, the micro LED may have higher efficiency in converting electricity to photons compared to the LCD or the OLED. That is, a "brightness per watt" compared to the LCD or the OLED display is higher. Accordingly, the micro LED may be configured to show a same brightness with an energy of about half compared to the LED (width, length and height respectively exceeding 100 mm) or the OLED. In addition to the above, the micro LED may realize a high resolution, a superior color, shading and brightness, express color of a wide range accurately, and realize a screen that is clear even in the outdoors where sunlight is bright. Further, the micro LED may be guaranteed a long life span because it is strong against a burn-in phenomenon and there is no deformation due to little heat being generated. The micro LED may have a flip chip structure in which an anode electrode and a cathode electrode are formed at a same first surface and a light-emitting surface is formed at a second surface positioned at an opposite side of the first surface at which the electrodes are formed.

In the disclosure, one pixel may include at least three sub pixels. One sub pixel may be a micro self-luminescence element for displaying an image, and may refer to, for example, a micro LED, a blue micro LED, or an ultraviolet (UV) micro LED. A blue micro LED may be a self-luminescence element that emits light of a blue wavelength range (450-490 nm), and the UV micro LED may be a self-luminescence element that emits light of a ultraviolet wavelength range (360-410 nm).

In the disclosure, the one sub pixel may include, in addition to the one micro self-luminescence element, a color conversion layer and a color filter corresponding thereto. The color conversion layer may emit a color of a predetermined wavelength range by being excited by light diverged from the micro self-luminescence element. The color conversion layer may be formed of a material including a nanophosphor or a quantum dot.

One sub pixel area may refer to an area to which a color of a corresponding sub pixel is exhibited by light emitted from the one sub pixel. One surface area (horizontal length 8 vertical length) of the color conversion layer which corresponds to the sub pixel may be greater than a light emitting surface area of the sub pixel. In this case, the sub pixel area may correspond to the area of the color conversion layer.

In the disclosure, a substrate may be disposed with a thin film transistor (TFT) layer on which a TFT circuit is formed at a front surface, and disposed with a timing controller configured to control a power supply circuit and a data driving driver configured to supply power to the TFT circuit at a rear surface, a gate driving driver and respective driving drivers at the rear surface. Multiple pixels arranged on the TFT layer may be driven by the TFT circuit.

In the disclosure, a glass substrate, a synthetic resin-based (e.g., polyimide (PI), polyethylene terephthalate (PET), polyethersulfone (PES), polyethylene naphthalate (PEN), polycarbonate (PC), etc.) substrate, or a ceramic substrate may be used for the substrate.

In the disclosure, the TFT layer on which the TFT circuit is formed may be disposed at the front surface of the substrate, and circuits may not be disposed at the rear surface of the substrate. The TFT layer may be formed integrally on the substrate or adhered to one surface of the glass substrate manufactured in a separate film form.

In the disclosure, the front surface of the substrate may be divided into an active area and a dummy area. The active area may correspond to an area occupied by the TFT layer at the front surface of the substrate, and the dummy area may be an area excluding the area occupied by the TFT layer at the front surface of the substrate.

In the disclosure, an edge area of the substrate may be an outermost side area of the glass substrate. In addition, the edge area of the substrate may be a remaining area excluding an area at which a circuit of the substrate is formed. In addition, the edge area of the substrate may include a part of the front surface of the substrate which is adjacent to a side surface of the substrate and a part of the rear surface of the substrate which is adjacent to the side surface of the substrate. The substrate may be formed as a quadrangle type. Specifically, the substrate may be formed as a rectangle type or a square type. The edge area of the substrate may include at least one side from among the four sides of the glass substrate.

In the disclosure, the TFT forming the TFT layer (or backplane) is not limited to a specific structure or type. For example, the TFT referred in the disclosure may be realized with an oxide TFT and an Si TFT (poly silicon, a-silicon), an organic TFT, a graphene TFT, and the like in addition to a low-temperature polycrystalline silicon (LTPS) TFT, and may be applied by making only a P type (or N type) metal-oxide-semiconductor field-effect transistor (MOSFET) in a Si wafer complementary metal-oxide-semiconductor (CMOS) process.

In the disclosure, a pixel driving method of the display module may be an active matrix (AM) driving method or a passive matrix (PM) driving method. The display module may be configured to form a wiring pattern to which the respective micro LEDs are electrically connected according to the AM driving method or the PM driving method.

In the disclosure, one pixel area may be disposed with a plurality of pulse amplitude modulation (PAM) control circuits. In this case, respective sub pixels disposed at the one pixel area may be controlled by the corresponding PAM control circuits. In addition, the one pixel area may be disposed with a plurality of pulse width modulation (PWM) control circuits. In this case, the respective sub pixels disposed at the one pixel area may be controlled by the corresponding PWM control circuits.

In the disclosure, the one pixel area may be disposed with both the plurality of PAM control circuits and the plurality of PWM control circuits. In this case, some from among the sub pixels disposed at the one pixel area may be controlled by the PAM control circuit and the remaining may be controlled through the PWM control circuit. In addition, the respective sub pixels may be controlled by the PAM control circuit and the PWM control circuit.

In the disclosure, the display module may include multiple side surface wirings of a thin film thickness disposed at a certain distance along the side surface of the TFT substrate.

In the disclosure, the display module may include multiple through wiring members formed so as to not be exposed toward the side surface of the TFT substrate in place of the side surface wiring exposed toward the side surface of the TFT substrate. Accordingly, by minimizing the dummy area and maximizing the active area at the front surface of the TFT substrate, bezel-less-ness may be achieved, and a mounting density of the micro LEDs with respect to the display module may be increased.

In the disclosure, based on coupling multiple display modules realizing bezel-less-ness, a large size multi display device capable of maximizing the active area may be provided. In this case, the respective display modules may be formed to maintain a pitch between the respective pixels of the display module adjacent to one another to be the same as a pitch between the respective pixels in a signal display module based on to minimizing the dummy area. Accordingly, this may be one method for a seam to be not visible at a coupling part between the respective display modules.

In the disclosure, a driving circuit may be realized by a micro integrated circuit (IC) configured to control the driving of at least 2n pixels disposed at the pixel area. Based on applying the micro IC to the display module, rather than the TFT, only a channel layer coupling the micro IC with the respective micro LEDs may be formed at the TFT layer (or backplane).

In the disclosure, the display module may be installed, as a single unit, in a wearable device, a portable device, a handheld device, and an electronic product requiring various displays or applied in an electric field, and may be applied to a display device such as, for example, and without limitation, a monitor for a personal computer, a high resolution TV and signage (or, digital signage), an electronic display, or the like through a plurality of assemblies as a matrix type.

The display module according to an embodiment will be described below with reference to the drawing.

FIG. 1 is diagram illustrating a display module according to an embodiment.

Figure 2:
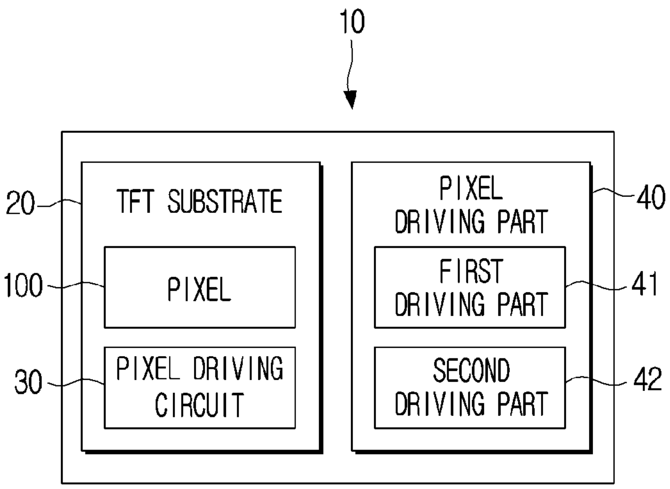
FIG. 2 is a diagram illustrating a display module according to an embodiment.

FIG. 2 is a diagram illustrating a display module according to an embodiment.

Referring to FIG. 1 and FIG. 2, the display module 10 according to the disclosure may include a TFT substrate 20 formed with multiple pixel driving circuits 30, multiple pixels 100 arranged at the front surface of the TFT substrate 20, and a panel driving part 40 configured to generate a control signal and provide the generated control signal to the multiple pixel driving circuits 30.

One pixel may include multiple sub pixels. The one sub pixel may include one light source and a color conversion layer and a color filter corresponding to the respective light sources. The light source may be an inorganic self-light emitting diode, and may be, for example, a vertical cavity surface emitting laser (VCSEL) diode having a size of less than or equal to 100 μm (e.g., less than or equal to 30 μm) or a micro LED. The VCSEL diode and the micro LED may emit light of a blue wavelength range (450-490 nm) or emit light of an ultraviolet wavelength range (360-410 nm). A structure of a pixel 100 will be described in detail below with reference to FIG. 3.

The TFT substrate 20 may include a glass substrate 21, a TFT layer 23 on which TFT circuitry is included at the front surface of the glass substrate 21, multiple side surface wirings 25 electrically coupling the TFT circuit of the TFT layer 23 and the circuits disposed at the rear surface of the glass substrate.

A synthetic resin-based (e.g., PI, PET, PES, PEN, PC, etc.) substrate having a flexible material or a ceramic substrate may be used as a substitute of the glass substrate 21.

The TFT substrate 20 may include an active area 20*a* representing an image and a dummy area 20*b* incapable of representing an image at the front surface.

Figure 3:
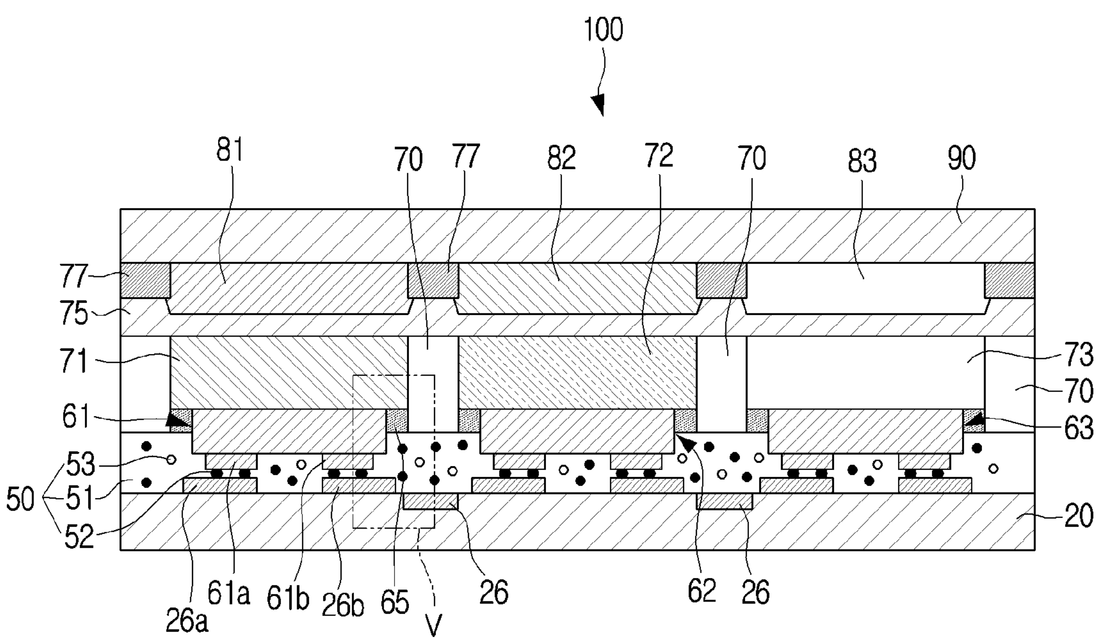
FIG. 3 is a diagram illustrating a single pixel of a display module according to an embodiment.

The active area 20*a* may be divided into multiple pixel areas 24 at which multiple pixels are respectively arranged. The multiple pixel areas 24 may be divided into various forms, and as an example, may be divided into a matrix form. One pixel area 24 may be included with one pixel 100 (FIG. 3).

The dummy area 20*b* may be included in the edge area of the glass substrate, and multiple connection pads 28*a* which are disposed spaced apart at a certain distance along the edge area may be formed. The multiple connection pads 28*a* may be electrically coupled with the respective pixel driving circuits 30 through the respective wirings 28*b*.

The number of connection pads 28*a* formed in the dummy area 20*b* may vary according to the number of pixels realized on the glass substrate, and may vary according to the driving method of the TFT circuit disposed in the active area 20*a*. For example, the TFT circuit disposed in the active area 20*a* may require more wirings and connection pads for the AM driving method which drives the respective pixels individually compared to the PM driving method which drives multiple pixels in a horizontal line and a vertical line.

The TFT layer 23 may include multiple data signal lines disposed horizontally, multiple gate signal lines disposed vertically, and multiple pixel driving circuits 30 electrically coupled to the respective lines to control the multiple pixels 100.

The panel driving part 40 may be directly coupled to the substrate in a chip on glass (COG) or a chip on plastic (COP) bonding method, or indirectly coupled to the TFT substrate 20 through a separate flexible printed circuit board (FPCB) in a film on glass (FOG) bonding method. The panel driving part 40 may drive the multiple pixel driving circuits 30 to control the emission of multiple micro LEDs which are electrically coupled to the respective pixel driving circuits 30.

The panel driving part 40 may be configured to control the multiple pixel driving circuits 30 by the respective lines through a first driving part 41 and a second driving part 42. The first driving part 41 may be configured to generate a control signal for sequentially controlling the multiple horizontal lines formed on the TFT substrate 20 for each line per image frame, and transmit the generated control signal to the pixel driving circuits 30 which are respectively coupled to the corresponding lines. The second driving part 42 may be configured to generate a control signal for sequentially controlling the multiple vertical lines formed on the TFT substrate 20 for each line per image frame, and transmit the generated control signal to the pixel driving circuits 30 which are respectively coupled to the corresponding lines.

Figure 4:
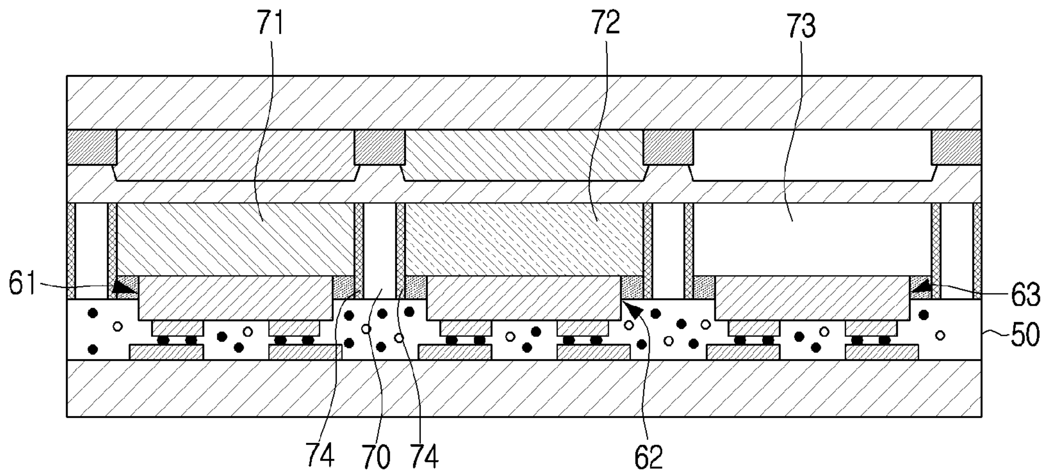
FIG. 4 is a diagram illustrating an example of a metal film formed at a side surface of a partition wall according to an embodiment.
Figure 5:
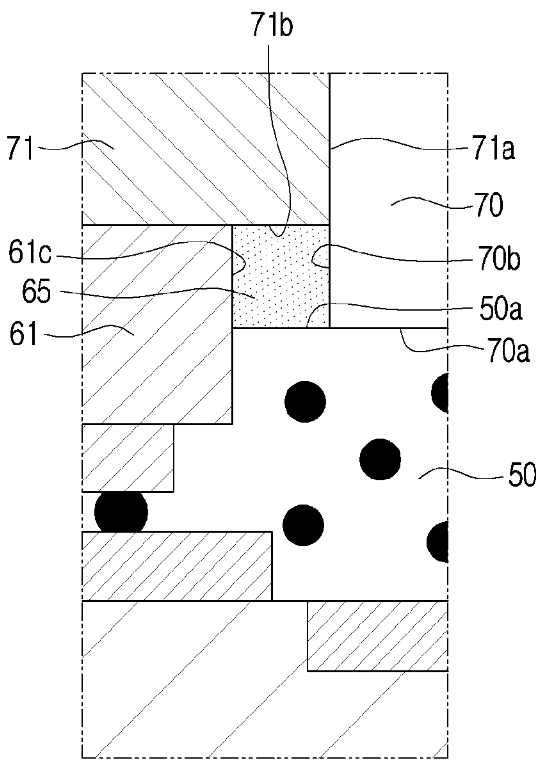
FIG. 5 is a diagram illustrating an enlarged V part shown in FIG. 3 according to an embodiment.

FIG. 3 is a diagram illustrating a single pixel of a display module according to an embodiment. FIG. 4 is a diagram illustrating an example of a metal film formed at a side surface of a partition wall according to an embodiment. FIG. 5 is a diagram illustrating an enlarged V part shown in FIG. 3 according to an embodiment.

Referring to FIG. 3, the one pixel 100 may be included in the one pixel area 24 (FIG. 1).

The pixel 100 may include at least three micro LEDs 61, 62 and 63 which emit light of the same color, for example, light of a blue wavelength range (450-490 nm).

The first to third micro LEDs 61, 62 and 63 may be electrically and physically coupled to the TFT substrate 20 through a light absorption layer 50 formed at the front surface of the TFT substrate 20.

The light absorption layer 50 may include a transparent thermosetting resin 51 (hereinafter, referred to as a 'transparent resin'), multiple conductive balls 52 distributed within the transparent thermosetting resin 51, and a light absorbing material 53 of a size smaller than the conductive ball 52.

The transparent resin 51 may use, for example, an epoxy resin, a polyurethane resin, an acrylic resin, and the like.

The conductive ball 52 have a fine diameter (e.g., 3-15 urn) and may be a conductor. The conductive ball 52 may include, for example, a polymer particle and a conductive film of gold (Au), nickel (Ni), palladium (Pd), and the like which are coated at the surface of the polymer particle. In this case, based on the multiple conductive balls 52 being distributed within the transparent resin 51, the light absorption layer 50 may have conductivity in a compression direction, and have insulation in the vertical direction of the compression direction. The light absorption layer 50 may be an anisotropic conductive film (ACF) including a multiple light absorbing materials 53 of a particle type.

The light absorbing material 53 may be metal nanoparticles capable of light absorption. The light absorbing material 53 may, for example, use nano-sized Au, platinum (Pt) or silver (Ag) particles or be formed of Au alloy, Pt alloy or Ag alloy particles.

The light absorption layer 50 may include a resin having a black-based color by applying a light absorbing color, for example, a dye or a pigment rather than the transparent resin 51 and multiple conductive balls distributed within the resin. The resin having a black-based color may absorb light emitted from the side surface and the rear surface of the micro LED. In this case, the light absorption layer may include or omit the multiple light absorbing materials 53.

The first to third micro LEDs 61, 62 and 63 may have a flip chip structure in which two chip electrodes 61*a* and 61*b* which are anode and cathode electrodes are formed at an opposite side of the light emitting surface. The first and second chip electrodes 61*a* and 61*b* may be formed of any one from among aluminum (Al), titanium (Ti), chromium (Cr), Ni, Pd, Ag, germanium (Ge) and Au or as an alloy thereof.

When the first to third micro LEDs 61, 62 and 63 are transferred to the TFT substrate 20, the first to third micro LEDs 61, 62 and 63 are seated at the surface of the light absorbing material 53 which is adhered to the TFT substrate 20. Then, the first to third micro LEDs 61, 62 and 63 may all be inserted inside the light absorbing material 53 by a predetermined depth through a thermocompression process. Accordingly, the first to third micro LEDs 61, 62 and 63 may be physically fixed to the TFT substrate 20.

In addition, based on the first micro LED 61 being pressed toward the TFT substrate 20 by the thermocompression process, the chip electrodes 61*a* and 61*b* of the first micro LED 61 may be positioned adjacent to substrate electrode pads 26*a* and 26*b*. In this case, the chip electrodes 61*a* and 61*b* of the first micro LED 61 may be electrically coupled with the substrate electrode pads 26*a* and 26*b* due to the conductive ball 52 positioned between the chip electrodes 61*a* and 61*b* of the first micro LED 61 and the substrate electrode pads 26*a* and 26*b*. Likewise, the second and third micro LEDs 62 and 63 may also be electrically coupled to the substrate electrode pads corresponding to the respective chip electrodes through the conductive ball 52 in the same method as the first micro LED 61.

First and second color conversion layers 71 and 72 may include a nanophosphor which converts light emitted from the first and second micro LEDs 61 and 62, as an excitation light, into respective lights of different wavelength ranges from one another and emits the converted light. The nanophosphor represents a different physical characteristic compared to a phosphor of the related art of which the diameter of the particle is several μm. For example, luminance efficiency may be improved because the wavelength of light that emits light has high energy due an energy band gap which is an energy level structure of a quantum state of electrons within a nanophosphor crystal is large. The nanophosphor may improve the display efficiency as colliding electrons effectively contribute in the luminescence based on particle density of phosphor increasing compared to phosphor having a bulk structure.

The first color conversion layer 71 may include a red nanophosphor capable of emitting light of a red wavelength range by being be excited by a light of a blue wavelength range emitted from the first micro LED 61. For example, the red nanophosphor may be SCASN ($Si_{1-x}Ca_xAlSiN_3:Eu^{2+}$). In this case, the red nanophosphor may have a particle size distribution median value $d_{50}$ of less than 0.5 μm (for example, 0.1 μm<$d_{50}$<0.5 μm).

The second color conversion layer 72 may include a green nanophosphor capable of emitting light of a green wavelength range by being excited by light of a blue wavelength range emitted from the second micro LED 62. For example, the green nanophosphor may be β-SiAlON ($Si_{6-z}Al_zO_zN_{8-z}:Eu^{2+}$) or $SrGa_2S_4$. In this case, the green nanophosphor may have a particle size distribution median value $d_{50}$ of less than 0.5 μm (for example, 0.1 μm<$d_{50}$<0.5 μm).

The first color conversion layer 71 may be formed of a material which includes a red quantum dot that emits light of a red wavelength range as an alternative of the red nanophosphor. In this case, the second color conversion layer 72 may be formed of a material which includes a green quantum dot that emits light of a green wavelength range as an alternative of the green nanophosphor.

A first transparent resin layer 73 may be formed of a material which may not affect or minimize an effect to transmittance, reflectivity and a refractive index of light emitted from the third micro LED 63. The first transparent resin layer 73 may be omitted according to circumstance, and at this time an air layer may be present at the light emitting surface side of the third micro LED 63.

In addition, the pixel 100 may include first and second color filters 81 and 82 corresponding to the respective first and second color conversion layers 71 and 72, and include a second transparent resin layer 83 corresponding to the first transparent resin layer 73.

The first color filter 81 may be a red color filter which passes a color wavelength that is the same as the light color of the red wavelength range emitted from the first color conversion layer 71. The second color filter 82 may be a green color filter which passes a color wavelength that is the same as the light color of the green wavelength range emitted from the second color conversion layer 72.

The second transparent resin layer 83 may be formed of a material which may not affect or minimize an effect to the transmittance, the reflectivity, and the refractive index of light that passed the first transparent resin layer 73. In addition, the second transparent resin layer 83 may be an optical film which minimizes light being wasted and improves brightness by directing the direction of light toward the front surface through refraction and reflection.

The first to third micro LEDs 61, 62 and 63 may have a predetermined thickness and may be formed as a square type with a same width and length, or as a rectangle type with a different width and length. The micro LED as described above may realize a real high dynamic range (HDR), and provide an improved brightness and black expression, and a high contrast ratio compared to an OLED. The size of the micro LED may be less than or equal to 100 μm or for example, less than or equal to 30 μm.

Referring to FIG. 3, the pixel 100 may be configured such that a light emitting area of the first to third micro LEDs 61, 62 and 63 may be divided by a partition wall 70. The partition wall 70 may be formed roughly in a grid shape. The multiple light emitting areas divided by the partition wall 70 may respectively correspond to one sub pixel area.

The partition wall 70 may be configured such that a top end is in close contact (e.g., in direct contact with or near direct contact with) with a planarization layer 75 and a bottom end is in close contact with (e.g., in direct contact with or near direct contact with) a top surface of the light absorption layer 50. In the respective light emitting areas divided by the partition wall 70, the first color conversion layer 71, the second color conversion layer 72, and the first transparent resin layer 73 may be disposed.

Accordingly, the light emitted to the side surface of the first color conversion layer 71 corresponding to the first micro LED 61 may be reflected by the partition wall 70 and emitted to the first color filter 81. In addition, the light emitted to the side surface of the second color conversion layer 72 corresponding to the second micro LED 62 may be reflected by the partition wall 70 and emitted to the second color filter 82.

The partition wall 70 may have a white-based color with superior light reflectivity to function as a reflector. Here, the white-based color may include a true white and an off-white. The off-white may refer to all colors close to white.

The partition wall 70 may also be formed of a metal material having high reflectivity so as to function as a reflector. In addition, the partition wall 70 may be formed with a metal film 74 having high light reflectivity stacked to the side surface as in FIG. 4. In this case, it is not necessary for the partition wall 70 to have a white-based color.

The light emitting surface of the first to third micro LEDs 61, 62 and 63 may be positioned at roughly the same height from the top surface of the TFT substrate 20. In addition, the light emitting surface of the first to third micro LEDs 61, 62 and 63 may be positioned at a position higher than the bottom end of the partition wall 70. In this case, parts of the side surfaces of the first to third micro LEDs 61, 62 and 63 may face the partition wall 70. Accordingly, the light emitted from the side surfaces of the first to third micro LEDs 61, 62 and 63 may be reflected by the partition wall 70 and emitted to the first color conversion layer 71, the second color conversion layer 72, and the first transparent resin layer 73, respectively.

Accordingly, the partition wall 70 may maximize luminance efficiency by reflecting the light emitted from the side surfaces of the first to third micro LEDs 61, 62 and 63, the light emitted from the side surface of the first and second color conversion layers 71 and 72, and the light emitted from the side surface of the third micro LED 63, respectively, and emitting to the front surface of the display module 10.

Between the first and second color conversion layers 71 and 72 and the first and second color filters 81 and 82, a planarization layer 75 may be disposed. In addition, the planarization layer 75 may also be disposed between the first transparent resin layer 73 and the second transparent resin layer 83. The first transparent resin layer 73 may be disposed on a same plane as with the first and second color conversion layers 71 and 72, and the second transparent resin layer 83 may be disposed on the same plane as with the first and second color filters 81 and 82.

The planarization layer 75 may be stacked over the first and second color filters 81 and 82 and the second transparent resin layer 83 prior to forming the partition wall 70 when manufacturing the a first part 11 (FIG. 9) of the display module 10.

The planarization layer 75 may be formed of a material which may not affect or minimize effect to the transmittance, the reflectivity, and the refractive index of light which passed the first and second color conversion layers 71 and 72 and the first transparent resin layer 73.

The first and second color filters 81 and 82 and the second transparent resin layer 83 may be divided therebetween by a black matrix 77 which is formed in a grid form. The shape of the black matrix 77 may be formed in the grid form to correspond to the shape of the partition wall 70. In this case, the width of the black matrix 77 may be formed similarly with the width of the partition wall 70.

At a top side of the first and second color filters 81 and 82 and the second transparent resin layer 83, a transparent cover layer 90 may be formed. The transparent cover layer 90 may prevent the pixel 100 from being contaminated by a foreign substance and protect the pixel 100 from being damaged from an external force. The transparent cover layer 90 may apply the glass substrate.

In FIG. 3, although only the part of the partition wall 70, the planarization layer 75, the black matrix 77, and the transparent cover layer 90 corresponding to one pixel unit has been illustrated, the partition wall 70, the planarization layer 75, the black matrix 77, and the transparent cover layer 90 may be formed in a size roughly corresponding to the size of the TFT substrate 20.

The sizes of the first to third micro LEDs 61, 62 and 63 may be formed of a size that is less than the sizes of the first color conversion layer 71, the second color conversion layer 72, and the first transparent resin layer 73, respectively. Accordingly, a gap may be formed between the side surfaces of the first to third micro LEDs 61, 62 and 63 and the partition wall 70.

Referring to FIG. 5, the gap may be filled with an optical adhesive 65. The optical adhesive 65 may be in close contact with (e.g., in direct contact with or near direct contact with) a part of the side surface 61*c* of the first micro LED 61, a part of a bottom end side surface 70*b* of the partition wall 70, and a part of the top surface 50*a* of the light absorption layer 50, respectively. Accordingly, the partition wall 70 may be stably fixed to the TFT substrate 20 according to forming a firm coupling with a surrounding structure through the optical adhesive 65.

The optical adhesive 65 may be used to bond a first part 11 and a second part 12 of the display module 10, which will be described below, together.

Figure 6:
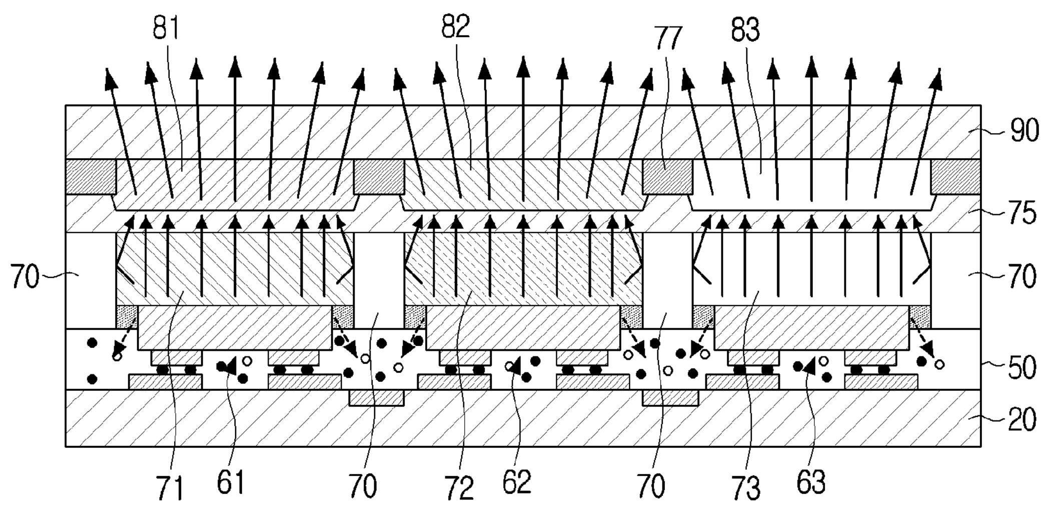
FIG. 6 is a diagram a path of light emitted from a self-luminescence element of a display module according to an embodiment.

FIG. 6 is a diagram a path of light emitted from a self-luminescence element of a display module according to an embodiment.

Referring to FIG. 6, emitted light is represented by the black arrows. The light emitted from the light emitting surface of the first micro LED 61 may mostly be emitted to the first color conversion layer 71. The first color conversion layer 71 may emit light of the red wavelength range by using the light emitted from the first micro LED 61 as the excitation light. In this case, the light emitted from the first color conversion layer 71 may be mostly emitted to the first color filter 81 directly, and the light emitted from the side surface of the first color conversion layer 71 may be emitted to the first color filter 81 after being reflected from the partition wall 70. The light emitted to the first color filter 81 may be transmitted through the first color filter 81 and emitted to a front direction of the display module 10. In this case, the light emitted from the side surface and a rear surface (e.g., the opposite surface of the light emitting surface of the first micro LED 61) of the first micro LED 61 may be mostly emitted to the light absorption layer 50 and may not be reflected to an adjacent sub pixel as the light is absorbed by the multiple light absorbing materials 53 included in the light absorption layer 50.

In addition, the light emitted from the respective side surface and rear surface of the second and third micro LEDs 62 and 63 may also not be reflected to the adjacent sub pixel as the light is mostly absorbed in the light absorption layer 50 like the light emitted from the respective side surface and rear surface of the first micro LED 61 described above.

Accordingly, cross-talk may be prevented by fundamentally blocking light of different colors emitted from different light sources within one pixel from being mixed.

A manufacturing process of the display module according to an embodiment will be described below.

Figure 7:
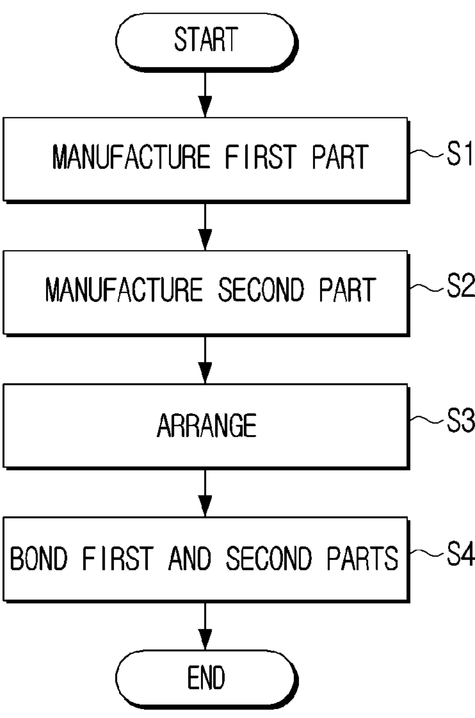
FIG. 7 is a flowchart of a manufacturing process of a display module according to an embodiment.

FIG. 7 is a flowchart of a manufacturing process of a display module according to an embodiment.

Referring to FIG. 7, a whole manufacturing process of the display module 10 according to an embodiment will be schematically described as below.

In operation S1, the first part 11 (FIG. 9) may be manufactured by sequentially forming the color filter, the planarization layer, the partition wall, and the color conversion layer on the glass substrate, and, in operation S2, a second part 12 (FIG. 11) may be manufactured by transferring the multiple micro LEDs to the TFT substrate 20 separately from the first part.

After seating the second part 12 in a die, the first apart 11 may be disposed at the top side of the second part 12 at a predetermined distance.

In operation S3, the first and second parts 11 and 12 are arranged. In operation S4, to bond the first and second parts 11 and 12 together, the first part 11 may be pressed toward the second part 12 and bonded together.

The manufacturing process of the first and second parts of the display module 10 and a bonding process of the first and second parts together according to an embodiment will be sequentially described in great detail below with reference to the drawing.

Figure 8:
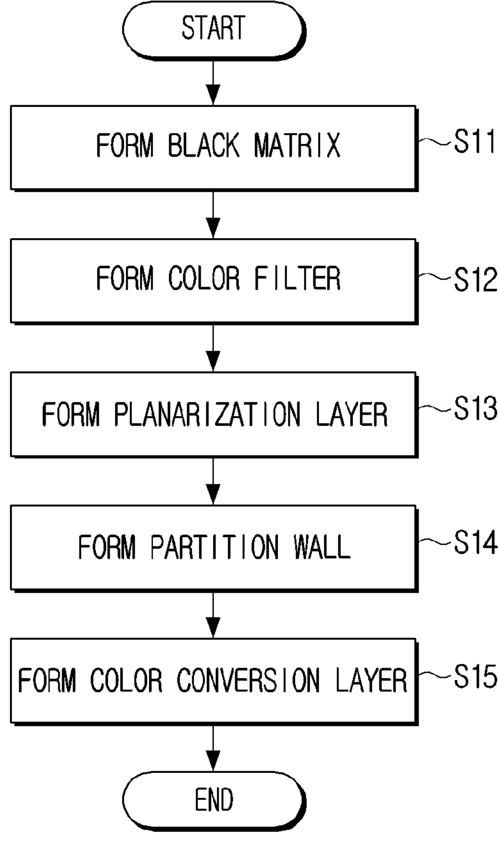
FIG. 8 is a flowchart of a manufacturing process of a first part of a display module according to an embodiment.

FIG. 8 is a flowchart of a manufacturing process of a first part of a display module according to an embodiment. FIG.

Figure 9:
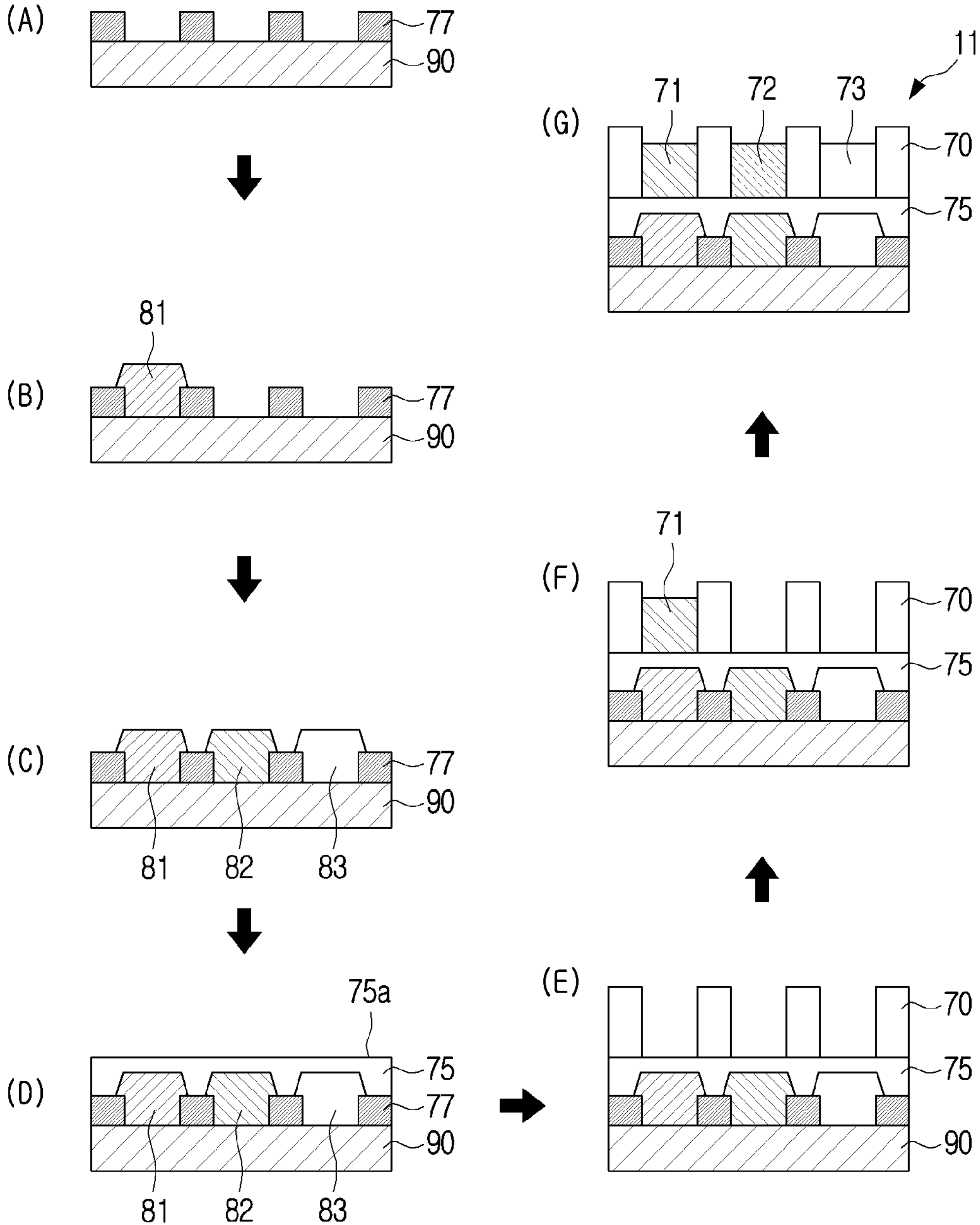
FIG. 9 is a diagram of a manufacturing process of a first part of a display module according to an embodiment.

9 is a diagram of a manufacturing process of a first part of a display module according to an embodiment. In FIG. 9, a part corresponding to one pixel may be enlarged and illustrated rather than illustrating the whole first part 11 of the display module 10.

Referring to FIG. 8 and FIG. 9, the first part 11 of the display module 10 may be manufactured in the order as described below.

In operation S11, the black matrix 77 may be formed in the grid form at one surface of the transparent cover layer 90.

Referring to (A) of FIG. 9, the transparent cover layer 90 may use, for example, a quadrangle type or a rectangle type glass substrate having a predetermined thickness. The size of the transparent cover layer 90 may roughly correspond with a rough size of the TFT substrate 20.

The black matrix 77 may form multiple cells based on being formed in the grid shape, and the respective cells may be the sub pixel area. Accordingly, in operation S12, the color filter may be formed in a pre-set cell from among the multiple cells of the black matrix 77.

For example, referring to (B) of FIG. 9, to form the first color filter 81, a red material may be uniformly applied to the whole one surface of the transparent cover layer 90 on which the black matrix 77 is formed. Then, only the area where the red is to remain may be exposed using a mask and the red material may be removed from the remaining area through development.

Then, referring to (C) of FIG. 9, to form the second color filter 82, a green material may be uniformly applied to the whole one surface of the transparent cover layer 90. Then, only the area where the green is to remain may be exposed using the mask and the green material may be removed from the remaining area through development.

Lastly, to form the second transparent resin layer 83, a transparent resin material may be uniformly applied to the whole one surface of the transparent cover layer 90. Then, only the area where the transparent resin is to remain may be exposed using the mask and the transparent resin material may be removed from the remaining area through development.

As a method of applying the color filter material and the transparent resin material to the transparent cover layer 90, a slit method of using a printer nozzle to evenly apply to a whole surface, a spin method of applying by spraying a liquid to a center and rotating a plate, and the like may be applied.

In operation S13 and referring to (D) of FIG. 9, based on the first and second color filters 81 and 82 and the second transparent resin layer 83 being formed, the planarization layer 75 which covers the first and second color filters 81 and 82 and the second transparent resin layer 83 may be formed to stack the partition wall 70 over the formed first and second color filters 81 and 82 and the second transparent resin layer 83.

The top surface 75*a* of the planarization layer 75 may have a flatness to an extent the partition wall 70 can be formed at a uniform height. The planarization layer 75 may be formed of a transparent material which does not affect the transmittance, the reflectivity, and the refractive index of light.

Then, in operation S14 and referring to (E) of FIG. 9 the partition wall 70 in the grid form may be formed at the top surface 75*a* of the planarization layer 75. The respective cells formed by the partition wall 70 may be formed at a position corresponding to the respective cells which is formed by the above-described black matrix 77. In this case, the respective cells formed by the partition wall 70 may correspond to the sub pixel area.

After the partition wall 70 is formed, in operation S15 and referring to (F) and (G) of FIG. 9, the first color conversion layer 71 and the second color conversion layer 72 may be sequentially patterned with a color conversion material (nanophosphor or quantum dot material) in the respective cells through an inkjet printing method.

As another method of forming the first and second color conversion layers 71 and 72, the first and second color conversion layers 71 may be formed through application, exposure, and development by mixing the nanophosphor or the quantum dot material in a photoresist similarly with the above-described manufacturing method of the color filter.

The first color conversion layer 71 may be formed of the red nanophosphor which may emit light of the red wavelength range, and the second color conversion layer 72 may be formed of the green nanophosphor which may emit light of the green wavelength range. Alternatively, the first color conversion layer 71 may be formed of red quantum dots, and the second color conversion layer 72 may be formed of green quantum dots.

After patterning the first and second color conversion layers 71 and 72 in the respective cells, the transparent resin material may be patterned through the inkjet printing method in the empty cells in which the first and second color conversion layers 71 and 72 are not formed and the first transparent resin layer 73 may be formed.

Through the process as described above, the first part 11 which forms a top plate of the display module 10 may be formed.

Figure 10:
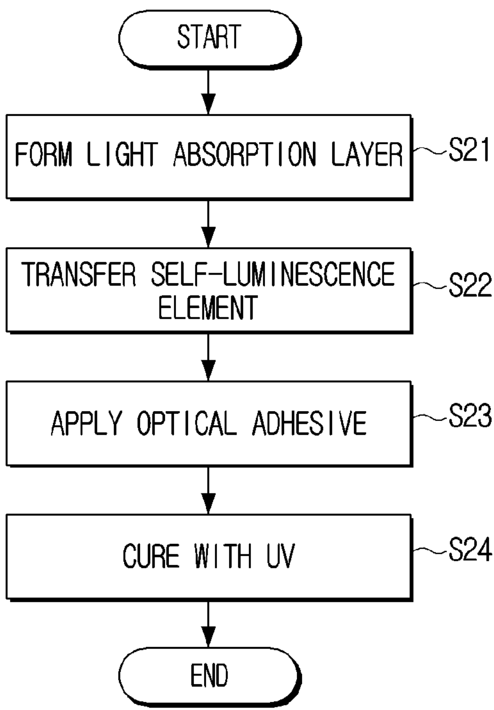
FIG. 10 is a flowchart of a manufacturing process of a second part of a display module according to an embodiment.
Figure 11:
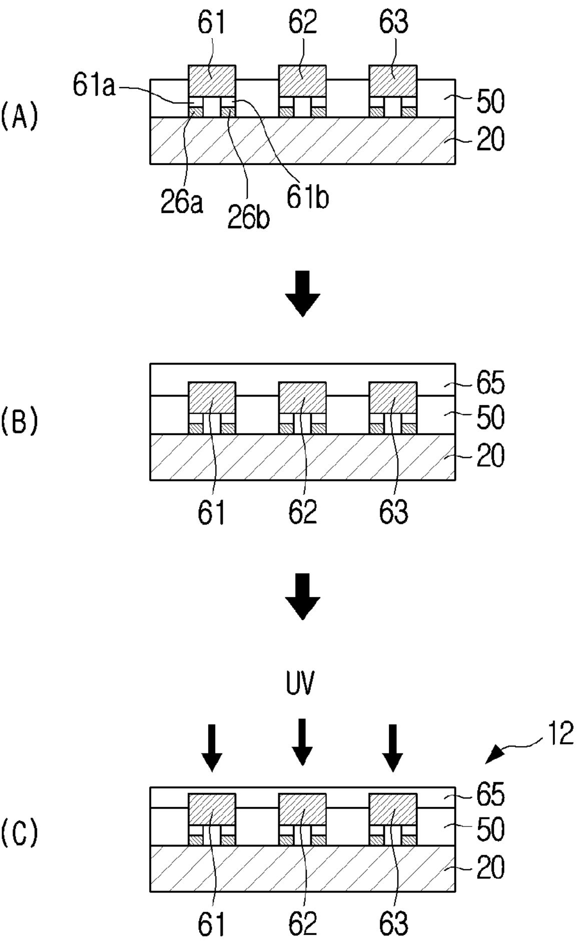
FIG. 11 is a diagram of a manufacturing process of a second part of a display module according to an embodiment.

FIG. 10 is a flowchart of a manufacturing process of a second part of a display module according to an embodiment. FIG. 11 is a diagram of a manufacturing process of a second part of a display module according to an embodiment. In FIG. 11, rather than illustrating the whole second part 12 of the display module 10, the part corresponding to one pixel has been enlarged and illustrated.

Referring to FIG. 10 and (A) of FIG. 11, in operation S21, the light absorption layer 50 may be formed at the front surface of the TFT substrate 20.

In this case, the light absorption layer 50 may be applied to the TFT substrate 20 to a predetermined thickness by inkjet printing when formed in a liquid state having a predetermined viscosity. In addition, based on the light absorption layer 50 being in a film form, the light absorption layer 50 may be laminated to the front surface of the TFT substrate 20.

After forming the light absorption layer 50 on the TFT substrate 20, in operation S22, the multiple micro LEDs may be transferred to the TFT substrate 20.

The micro LED transferring process may be carried out through a laser transfer method, a rollable transfer method, a pick and place transfer method, and the like. In this case, the first to third micro LEDs 61, 62 and 63 may be transported from respective EPI substrates to relay substrates (or interposer), and then transferred from the respective relay substrates to the TFT substrate 20 which is a target substrate.

When the first to third micro LEDs 61, 62 and 63 are transferred to the TFT substrate 20, the first to third micro LEDs 61, 62 and 63 are seated at the surface of the light absorbing material 53 which is adhered to the TFT substrate 20. In this state, the first to third micro LEDs 61, 62 and 63 may be inserted inwards the light absorbing material 53 by a predetermined depth through the thermocompression process. Accordingly, the first to third micro LEDs 61, 62 and 63 may be physically fixed to the TFT substrate 20. In addition, the chip electrodes of the respective micro LEDs 61, 62 and 63 may be electrically coupled with the corresponding substrate electrode pads by the multiple conductive balls 52 distributed in the light absorption layer 50.

The first to third micro LEDs 61, 62 and 63 may be the blue micro LED emitting light of the blue wavelength range.

Then, in operation S23 and referring to (B) of FIG. 11, the optical adhesive 65 to bond the first part 11 and the second part 12 together may be applied to the front surface of the TFT substrate 20.

The optical adhesive 65 may be applied to the TFT substrate 20 to cover the all of the multiple micro LEDs 61, 62 and 63. The optical adhesive 65 may be a UV curing silicon rubber (di-methyl siloxane) having curing properties after a certain time after UV exposure.

Then, in operation S24 and referring to (C) of FIG. 11, the optical adhesive 65 is irradiated with UV for a pre-set time and cured.

The second part 12 forming a bottom plate of the display module 10 may be formed through the process as described above.

The process of manufacturing the display module 10 by bonding the first part 11 and the second part 12 together will be described below.

Figure 12:
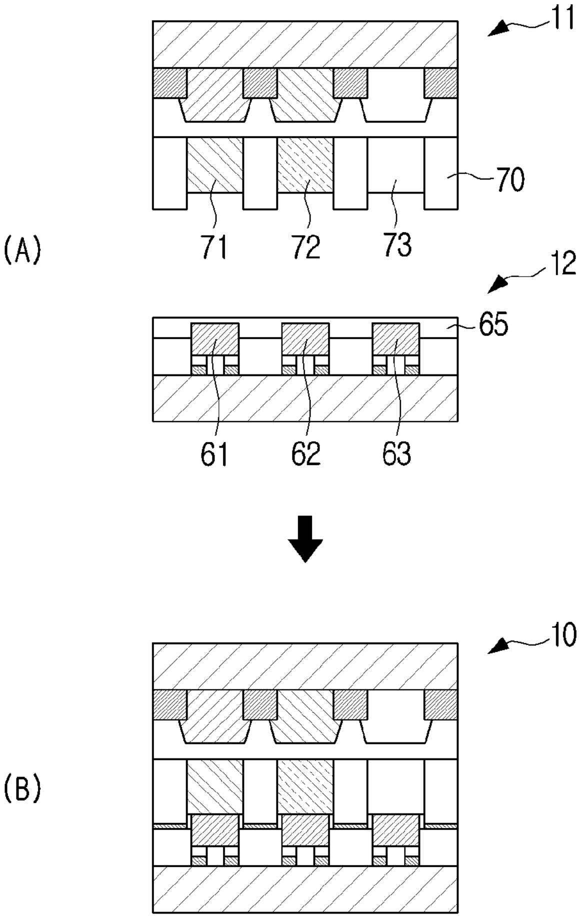
FIG. 12 is a diagram of a manufacturing process of a coupling of a first part and a second part of a display module according to an embodiment.

FIG. 12 is a diagram of a manufacturing process of a coupling of a first part and a second part of a display module according to an embodiment.

Referring to (A) of FIG. 12, after seating the second part 12 in the die, the first part 11 may be disposed at the top side of the second part 12 spaced apart by a predetermined distance.

Then, referring to (B) of FIG. 12, to bond the first and second parts 11 and 12 together, the first part 11 is reversed and the first color conversion layer 71, the second color conversion layer 72, and the first transparent resin layer 73 of the first part 11 may be arranged to a bonding position to correspond to the first to third micro LEDs 61, 62 and 63 of the second part 12, respectively.

In this case, it the first and second parts 11 and 12 may be disposed to maintain a parallel with each other with respect to the same plane.

After the first and second parts 11 and 12 are arranged to the bonding position, the first part 11 may be closely contacted to the second part 12 with a pre-set pressure and the first and second parts 11 and 12 may be bonded together. In this case, the first and second parts 11 and 12 may be adhered together by the optical adhesive 65.

After bonding the first and second parts 11 and 12 together, the bonding between the first and second parts 11 and 12 may be made firm by curing the optical adhesive 65.

The display module 10 according to an embodiment may be manufactured through the above-described process.

A display module according to one embodiment of the disclosure will be described below.

Although the display module 10 according to an embodiment described above is applied with the blue micro LED as a self-luminescence element for displaying an image, but a display module 10*a* (FIG. 18) according to another embodiment may be applied with a UV micro LED as the self-luminescence element for displaying an image.

Figure 13:
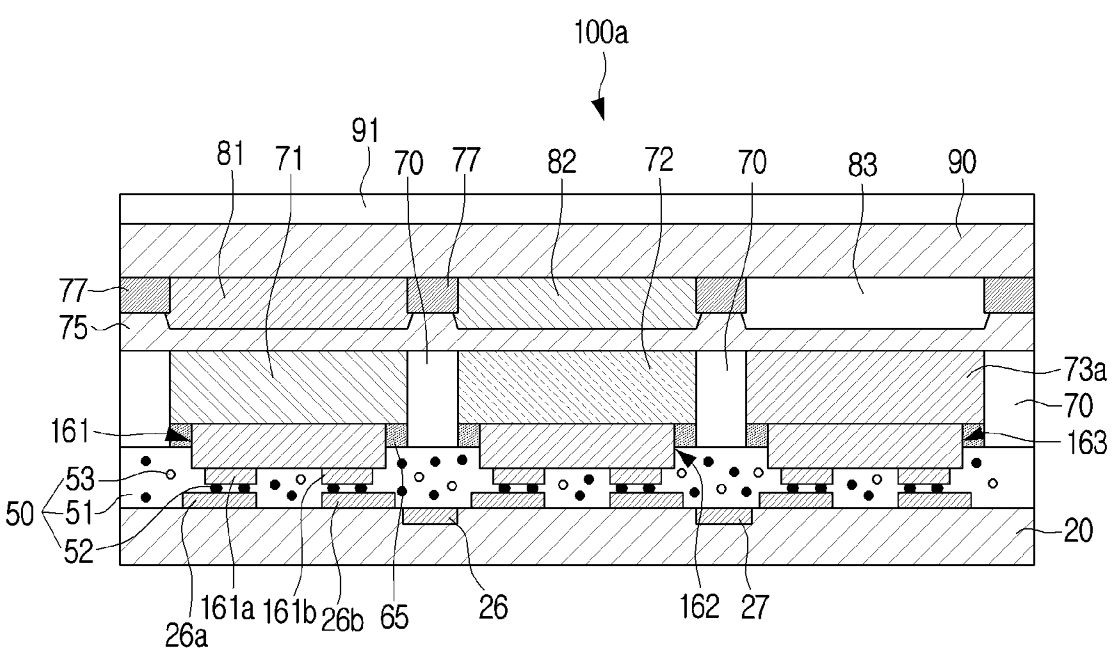
FIG. 13 is a diagram illustrating a single pixel of a display module according to an embodiment.

FIG. 13 is a diagram illustrating a single pixel of a display module according to an embodiment.

In describing the display module according to one embodiment, configurations which are the same as with the above-described display module 10 may be designated with the same reference numerals and the described thereof will be omitted, and configurations which are different from the above-described display module 10 will be mainly described.

The display module 10*a* may be arranged with the TFT substrate 20, and the TFT substrate 20 may be arranged with multiple pixels 100*a*.

Referring to FIG. 13, a pixel 100*a* of the display module 10*a* may include a first to third UV micro LEDs 161, 162 and 163 emitting light of an ultraviolet wavelength range (360-410 nm).

On the light emitting surfaces of the first to third UV micro LEDs 161, 162 and 163, the first to third color conversion layers 71, 72 and 73*a* may be respectively disposed.

The first to third color conversion layers 71, 72 and 73*a* may include the nanophosphor which converts light emitted from the first to third UV micro LEDs 161, 162 and 163, as excitation light, into light of different wavelength ranges from one another and emits the converted light.

The first color conversion layer 71 may include the red nanophosphor which may emit light of the red wavelength range by being excited by the light of the ultraviolet wavelength range emitted from the first UV micro LED 161. For example, the red nanophosphor may be SCASN ($Si_{1-x}Ca_x$-$AlSiN_3$:$Eu^{2+}$). In this case, the red nanophosphor may have a particle size distribution median value $d_{50}$ of less than 0.5 μm (for example, 0.1 μm<$d_{50}$<0.5 μm).

The second color conversion layer 72 may include the green nanophosphor which may emit light of the green wavelength range by being excited by the light of the ultraviolet wavelength range emitted from the second UV micro LED 162. For example, the green nanophosphor may be β-SiAlON ($Si_{6-z}Al_zO_zN_{8-z}$:$Eu^{2+}$) or $SrGa_2S_4$. In this case, the green nanophosphor may have a particle size distribution median value $d_{50}$ of less than 0.5 μm (for example, 0.1 μm<$d_{50}$<0.5 μm).

The third color conversion layer 73*a* may include the blue nanophosphor which may emit light of the blue wavelength range by being excited by the light of the ultraviolet wavelength range emitted from the third UV micro LED 163. For example, the blue nanophosphor may be BAM(BaMgxAly-Oz:Eun+). In this case, the blue nanophosphor may have a particle size distribution median value $d_{50}$ of less than 0.5 μm (for example, 0.1 μm<d50<0.5 μm).

Alternatively, the first color conversion layer 71 may be formed of red quantum dots, the second color conversion layer 72 may be formed of green quantum dots, and the third color conversion layer 73*a* may be formed of blue quantum dots.

At the top side of the first to third color conversion layers 71, 72 and 73*a*, the first color filter 81, the second color filter 82, and the second transparent resin layer 83 may be respectively disposed.

The sizes of the first to third UV micro LEDs 161, 162 and 163 may be formed smaller the sizes of the first to third color conversion layers 71, 72 and 73*a*, respectively. Accordingly, a gap may be formed between the side surfaces of the first to third micro LEDs 61, 62 and 63 and the partition wall 70 and the gap may be filled with the optical adhesive 65. Accordingly, the partition wall 70 may be stably fixed to the TFT substrate 20 according to forming a firm coupling with the surrounding structure through the optical adhesive 65.

In addition, a thin film UV cutoff filter 91 may be formed stacked at one surface of the transparent cover layer 90. The UV cutoff filter 91 may block UV rays emitted from the first to third UV micro LEDs 161, 162 and 163. The UV cutoff filter 91 may have a transmittance of less than or equal to 10% based on a wavelength of less than or equal to 400 nm.

The manufacturing process of the first and second parts and the bonding process of the first and second parts of the display module 10*a* according to an embodiment will be sequentially described in detail below with reference to the drawing.

Figure 14:
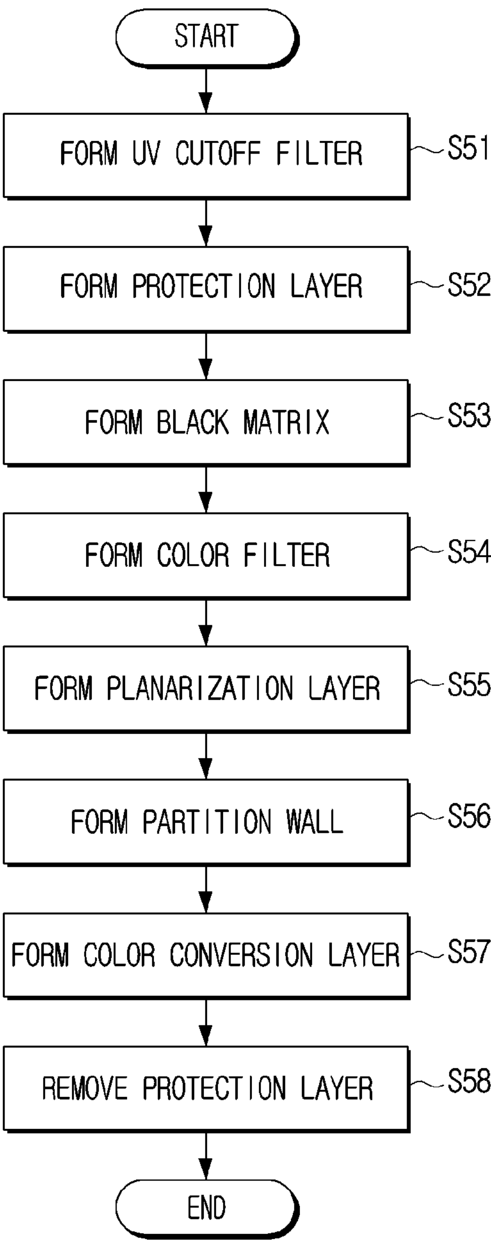
FIG. 14 is a flowchart of a manufacturing process of a first part of a display module according to an embodiment.
Figure 15:
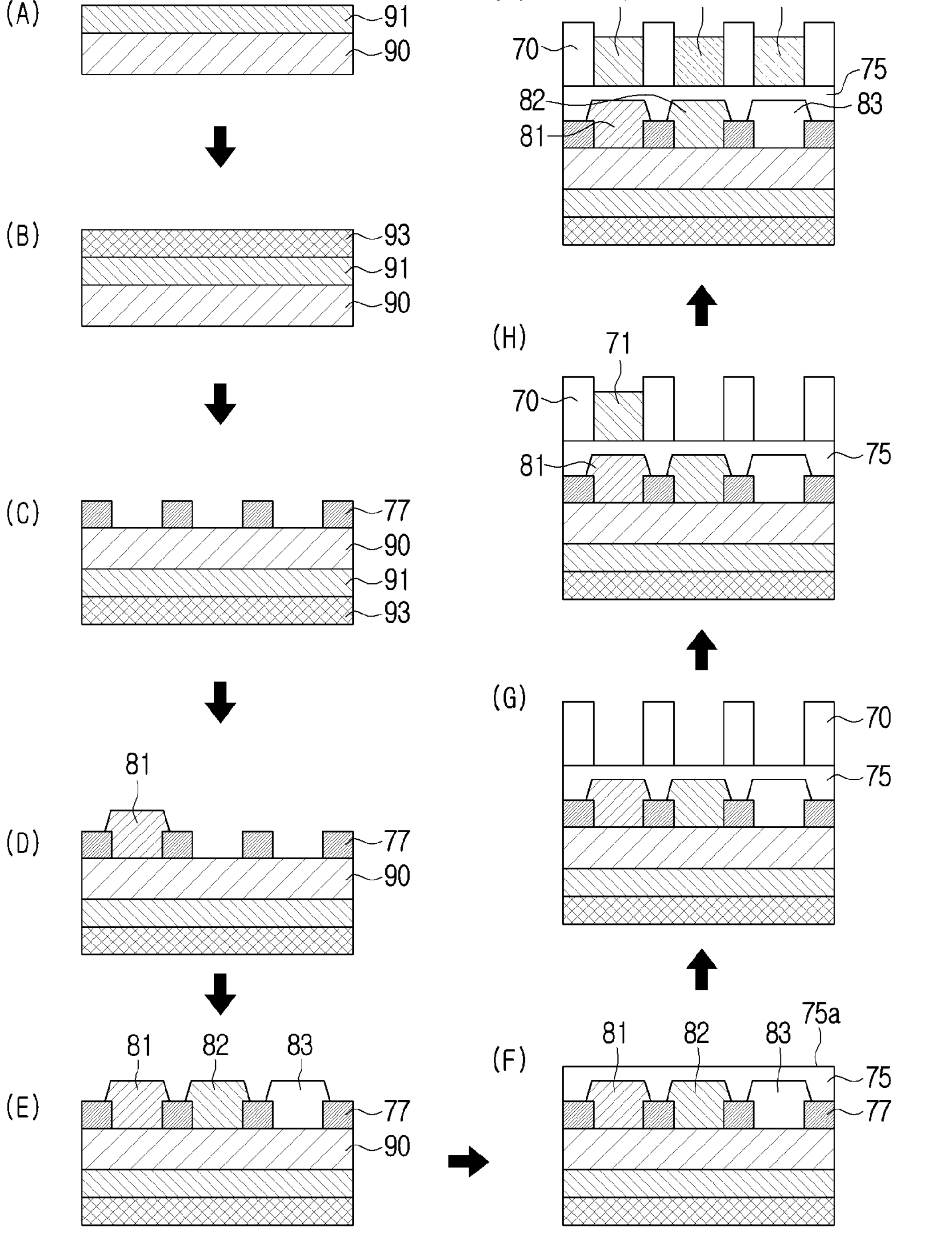
FIG. 15 is a diagram of a manufacturing process of a first part of a display module according to an embodiment.

FIG. 14 is a flowchart of a manufacturing process of a first part of a display module according to an embodiment. FIG. 15 is a diagram of a manufacturing process of a first part of a display module according to an embodiment. In FIG. 14, the part corresponding to one pixel is enlarged and illustrated rather than illustrating a whole first part 11*a* of the display module 10*a*.

Referring to FIG. 14 and FIG. 15, the first part 11*a* of the display module 10*a* may be manufactured through the order as described below.

First, in operation S51 and referring to (A) of FIG. 15, the thin film UV cutoff filter 91 may be formed at one surface of the transparent cover layer 90. The UV cutoff filter 91 may block the ultraviolet rays emitted from the first to third UV micro LEDs 161, 162 and 163.

In operation S52 and referring to (B) of FIG. 15, a protection layer 93 may be formed stacked on the UV cutoff filter 91 to protect the UV cutoff filter 91 while manufacturing the first part 11*a*.

Then, in operation S53 and referring to (C) of FIG. 15, the black matrix 77 may be formed in the grid form at the other surface of the transparent cover layer 90.

The transparent cover layer 90 may use, for example, a quadrangle type or a rectangle type glass substrate having a predetermined thickness. The size of the transparent cover layer 90 may roughly correspond with a rough size of the TFT substrate 20.

The black matrix 77 may form multiple cells based on being formed in the grid shape, and the respective cells may be the sub pixel area. Accordingly, in operation S54 and referring to (D) and (E) of FIG. 15, the color filter may be formed in the pre-set cell from among the multiple cells of the black matrix 77.

For example, to form the first color filter 81, a red material may be uniformly applied to the whole one surface of the transparent cover layer 90 on which the black matrix 77 is formed. Then, only the area where the red is to remain may be exposed using a mask and the red material may be removed from the remaining area through development.

Then, to form the second color filter 82, a green material may be uniformly applied to the whole one surface of the transparent cover layer 90. Then, only the area where the green is to remain may be exposed using the mask and the green material may be removed from the remaining area through development.

In addition, to form the second transparent resin layer 83, a transparent resin material may be uniformly applied to the whole one surface of the transparent cover layer 90. Then, only the area where the transparent resin is to remain may be exposed using the mask and the transparent resin material may be removed from the remaining area through development.

As a method of applying the color filter material and the transparent resin material to the transparent cover layer 90, a slit method of using a printer nozzle to evenly apply to a whole surface, a spin method of applying by spraying a liquid to a center and rotating a plate, and the like may be applied.

In operation S55 and referring to (F) of FIG. 15, based on the first and second color filters 81 and 82 and the second transparent resin layer 83 being formed, the planarization layer 75 which covers the first and second color filters 81 and 82 and the second transparent resin layer 83 may be formed to stack the partition wall 70 over the formed first and second color filters 81 and 82 and the second transparent resin layer 83.

The top surface 75*a* of the planarization layer 75 may have a flatness to an extent the partition wall 70 can be formed at a uniform height. The planarization layer 75 may be formed of a transparent material which does not affect the transmittance, the reflectivity, and the refractive index of light.

Then, in operation S56 and referring to (G) of FIG. 15, the partition wall 70 in grid form may be formed at the top surface 75*a* of the planarization layer 75. The respective cells formed by the partition wall 70 may be formed at a position corresponding to the respective cells which is formed by the above-described black matrix 77. In this case, the respective cells formed by the partition wall 70 may correspond to the sub pixel area.

After the partition wall 70 is formed, in operation S57 and referring to (H) of FIG. 15, the first to third color conversion layers 71, 72 and 73*a* may be sequentially patterned with a color conversion material (nanophosphor) in the respective cells through the inkjet printing method (S57).

As another method of forming the first to third color conversion layers 71, 72 and 73*a*, the first to third color conversion layers 71, 72 and 73*a* may be formed by applying, exposing, and developing the photoresist in which the nanophosphor is mixed similarly with the above-described manufacturing method of the color filter.

The first color conversion layer 71 may be formed of red nanophosphors which may emit light of the red wavelength range, and the second color conversion layer 72 may be formed of green nanophosphors which may emit light of the green wavelength range. The third color conversion layer 73*a* may be formed of blue nanophosphors which may emit light of the blue wavelength range.

Then, in operation S58 and referring to (I) of FIG. 15, the protection layer 93 may be removed from the UV cutoff filter 91. Thereby, the first part 11*a* which forms the top plate of the display module 10*a* may be formed.

Figure 16:
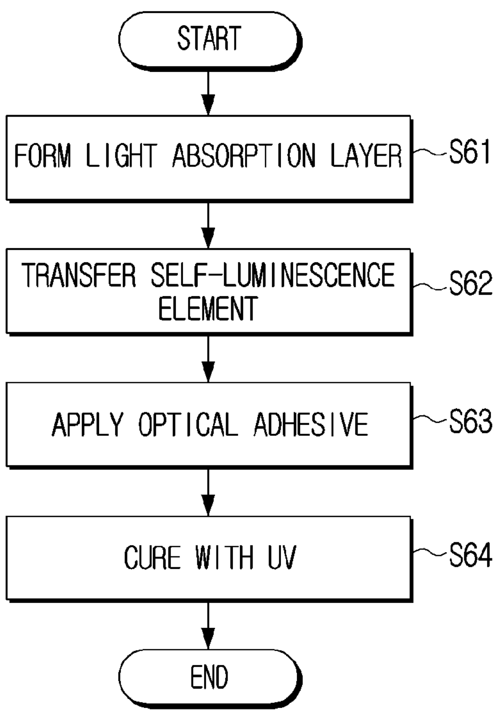
FIG. 16 is a flowchart of a manufacturing process of a second part of a display module according to an embodiment.
Figure 17:
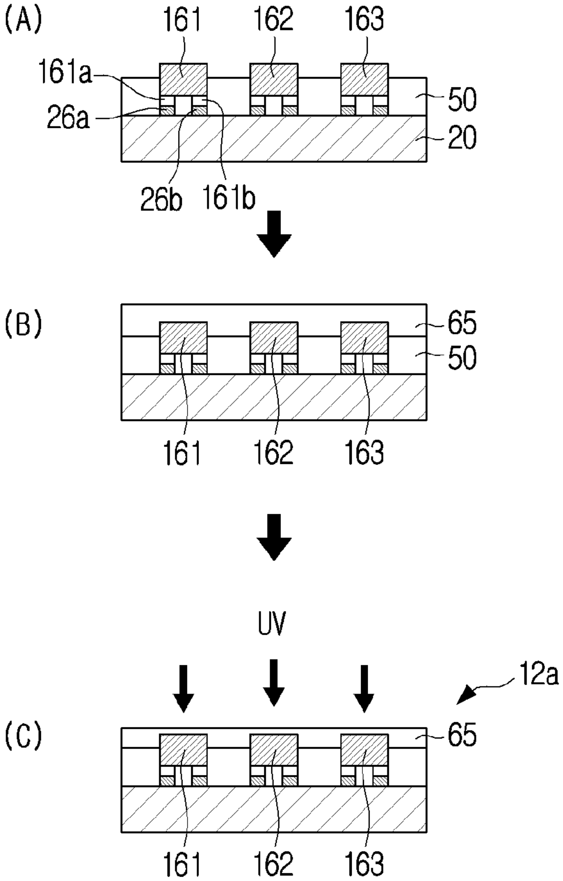
FIG. 17 is a diagram of a manufacturing process of a second part of a display module according to an embodiment.

FIG. 16 is a flowchart of a manufacturing process of a second part of a display module according to an embodiment. FIG. 17 is a diagram of a manufacturing process of a second part of a display module according to an embodiment. In FIG. 17, the part corresponding to one pixel has been enlarged and illustrated rather than illustrating a whole second part 12*a* of the display module 10*a*.

Referring to FIG. 16 and (A) of FIG. 17, in operation S61, the light absorption layer 50 may be formed at the front surface of the TFT substrate 20. In this case, the multiple substrate electrode pads 26*a* and 26*b* may be arranged at the front surface of the TFT substrate 20 by a certain distance.

After forming the light absorption layer 50 of a predetermined thickness at the TFT substrate 20, in operation S62 and referring to (B) of FIG. 17, the multiple UV micro LEDs 161, 162 and 163 may be transferred to the TFT substrate 20.

The UV micro LED transferring process may be carried out through the laser transfer method, the rollable transfer method, the pick and place transfer method, and the like. In this case, the first to third UV micro LEDs 161, 162 and 163 may be transported from the respective epi substrates to the relay substrates (or interposer), and then transferred from the respective relay substrates to the TFT substrate 20 which is the target substrate.

When the first to third micro LEDs 61, 62 and 63 are transferred to the TFT substrate 20, the first to third micro LEDs 61, 62 and 63 are seated at the surface of the light absorbing material 53 which is adhered to the TFT substrate 20. In this state, the first to third micro LEDs 61, 62 and 63 may be inserted inwards the light absorbing material 53 by a predetermined depth through the thermocompression process. Accordingly, the first to third micro LEDs 61, 62 and 63 may be physically fixed to the TFT substrate 20. In addition, the chip electrodes of the respective micro LEDs 61, 62 and 63 may be electrically coupled with the corresponding substrate electrode pads by the multiple conductive balls 52 distributed in the light absorption layer 50.

Then, in operation S63, the optical adhesive 65 to bond the first part 11*a* and the second part 12*a* together may be applied to the front surface of the TFT substrate.

The optical adhesive 65 may be applied to the TFT substrate 20 to cover the all of the multiple UV micro LEDs 161, 162 and 163. The optical adhesive 65 may be the UV curing silicon rubber (di-methyl siloxane) having curing properties after a certain time after UV exposure.

Then, in operation S64 and referring to (C) of FIG. 17, the optical adhesive 65 is irradiated with UV for a pre-set time and cured.

The second part 12*a* forming the bottom plate of the display module 10 may be formed through the process as described above.

The process of manufacturing the display module 10*a* by bonding the first part 11*a* and the second part 12*a* together will be described below.

Figure 18:
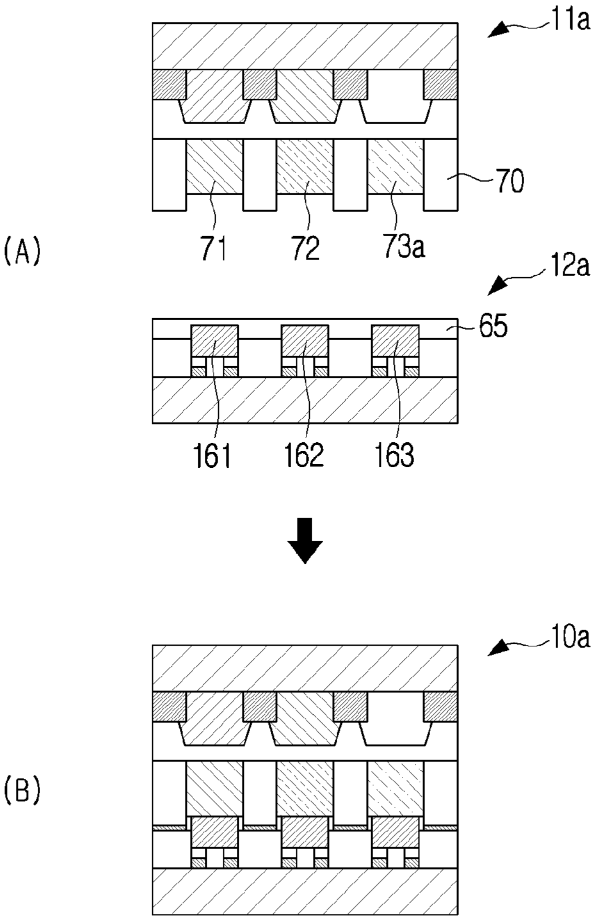
FIG. 18 is a diagram of a manufacturing process of a coupling of a first part and a second part of a display module according to another embodiment.

FIG. 18 is a diagram of a manufacturing process of a coupling of a first part and a second part of a display module according to another embodiment.

Referring to (A) FIG. 18, after seating the second part 12*a* in the die, the first part 11*a* may be disposed at the top side of the second part 12*a* by a predetermined distance.

Then, referring to (B) of FIG. 18, to bond the first and second parts 11*a* and 12*a* together, the first part 11*a* is reversed and the first to third color conversion layers 71, 72 and 73*a* of the first part 11*a* may be arranged to the bonding position to correspond to the first to third UV micro LEDs 161, 162 and 163 of the second part 12*a*.

In this case, it the first and second parts 11*a* and 12*a* may be disposed to maintain a parallel with each other with respect to the same plane.

After the first and second parts 11*a* and 12*a* are arranged to the bonding position, the first part 11*a* may be closely contacted to the second part 12*a* with a pre-set pressure and the first and second parts 11*a* and 12*a* may be bonded together. In this case, the first and second parts 11*a* and 12*a* may be adhered together by the optical adhesive 65.

After bonding the first and second parts 11*a* and 12*a* together, the bonding between the first and second parts 11*a* and 12*a* may be made firm by curing the optical adhesive 65.

The display module 10*a* according to another embodiment may be manufactured through the above-described process.

In the above, various embodiments of the disclosure have been described respectively and individually, but the respective embodiments may not necessarily be implemented on its own, and the configuration and operation of the respective embodiment may be implemented in combination with at least one other embodiment.

While the disclosure has been illustrated and described with reference to various example embodiments thereof, it will be understood that the various example embodiments are intended to be illustrative, not limiting. It will be understood by those skilled in the art that various changes in form and details may be made therein without departing from the true spirit and full scope of the disclosure, including the appended claims and their equivalents.

What is claimed is:

1. A display module comprising:

a substrate;

a conductive light absorption layer provided on a surface of the substrate; and a plurality of pixels electrically coupled to the substrate through the conductive light absorption layer, wherein each of the plurality of pixels comprises:

a first self-luminescence element, a second self-luminescence element and a third self-luminescence element, each of the first self-luminescence element, the second self-luminescence element and the third self-luminescence element being configured to emit light of a same color;

a first color conversion layer corresponding to a light emitting surface of the first self-luminescence element, wherein a bottom surface of the first color conversion layer directly contacts a top surface of the first self-luminescence element;

a second color conversion layer corresponding to a light emitting surface of the second self-luminescence element, wherein a bottom surface of the second color conversion layer directly contacts a top surface of the second self-luminescence element;

a first color filter corresponding to the first color conversion layer;

a second color filter corresponding to the second color conversion layer, wherein the display module further comprises a partition wall separating the first self-luminescence element and the second self-luminescence element, wherein a width of the first color conversion layer is greater than a width of the first self-luminescence element, and a width of the second color conversion layer is greater than a width of the second self-luminescence element, wherein the conductive light absorption layer directly contacts a lower side surface of the first self-luminescence element and a bottom surface of the partition wall, and wherein the display module further comprises a first optical adhesive directly contacting an upper side surface of the first self-luminescence element, the bottom surface of the first color conversion layer, a side surface of the partition wall, and a top surface of the conductive light absorption layer.

2. The display module of claim 1, wherein the conductive light absorption layer comprises:

a transparent resin;

a plurality of first conductive balls provided in the transparent resin; and a plurality of light absorbing materials provided in the transparent resin.

3. The display module of claim 2, wherein the transparent resin comprises an epoxy resin, a polyurethane resin, or an acrylic resin.

4. The display module of claim 2, wherein each of the plurality of first conductive balls comprises:

a polymer particle; and a conductive film coated on a surface of the polymer particle, and wherein the conductive film comprises gold (Au), nickel (Ni), or palladium (Pd).

5. The display module of claim 2, wherein the plurality of light absorbing materials comprises metal nanoparticles configured to absorb light.

6. The display module of claim 5, wherein the metal nanoparticles comprises Au, platinum (Pt), silver (Ag), an Au alloy, a Pt alloy or an Ag alloy.

7. The display module of claim 2, wherein the conductive light absorption layer comprises:

a resin with a black-based color; and a plurality of second conductive balls provided in the resin with the black-based color.

8. The display module of claim 1, wherein each of the first self-luminescence element, the second self-luminescence element, and the third self-luminescence element comprises a blue micro light emitting diode (LED).

9. The display module of claim 1, wherein the partition wall is configured to reflect light emitted from a side surface of the first color conversion layer, and a side surface of the second color conversion layer.

10. The display module of claim 9, wherein the partition wall is a white-based color.

11. The display module of claim 9, wherein the partition wall comprises a metal film at a surface of the partition wall.

12. The display module of claim 9, further comprising a second optical adhesive contacting the side surface of the second self-luminescence element and the bottom surface of the second color conversion layer, wherein the side surface of the first self-luminescence element is adhered to the partition wall by the first optical adhesive, and the side surface of the second self-luminescence element is adhered to the partition wall by the second optical adhesive.

13. The display module of claim 12, wherein the first color conversion layer is configured such that an area not corresponding to the light emitting surface of the first self-luminescence element from an entire area of one surface of the first color conversion layer is in contact with the first optical adhesive.

14. The display module of claim 12, wherein the first optical adhesive and the second optical adhesive comprise an ultraviolet (UV) curing silicon rubber.

15. The display module of claim 1, wherein the first color conversion layer comprises a first color conversion material which emits light of a red wavelength range, and the second color conversion layer comprises a second color conversion material which emits light of a green wavelength range.

16. A display module comprising:

a substrate;

a conductive light absorption layer provided on a surface of the substrate; and a plurality of pixels provided on the substrate, wherein each of the plurality of pixels comprises:

a self-luminescence element comprising a light emitting surface;

a color conversion layer corresponding to the light emitting surface of the self-luminescence element, wherein a bottom surface of the color conversion layer directly contacts a top surface of the self-luminescence element; and a color filter corresponding to the color conversion layer, wherein a width of the color conversion layer is greater than a width of the self-luminescence element, wherein the display module further comprises a partition wall separating the self-luminescence element from an adjacent self-luminescence element, wherein the conductive light absorption layer directly contacts a lower side surface of the self-luminescence element and a bottom surface of the partition wall, and wherein the display module further comprises a first optical adhesive directly contacting an upper side surface of the self-luminescence element, the bottom surface of the color conversion layer, a side surface of the partition wall, and a top surface of the conductive light absorption layer.

17. The display module of claim 16, wherein the conductive light absorption layer comprises:

a transparent resin;

a plurality of conductive balls provided in the transparent resin; and a plurality of light absorbing materials provided in the transparent resin.

18. The display module of claim 16, wherein the self-luminescence element comprises a blue micro light emitting diode (LED).

19. The display module of claim 16, wherein the color conversion layer comprises a color conversion material which emits light of a red wavelength range.

* * * * *